United States Patent [19]

Pogge et al.

[11] Patent Number: 5,770,884

[45] Date of Patent: Jun. 23, 1998

[54] VERY DENSE INTEGRATED CIRCUIT PACKAGE

[75] Inventors: H. Bernhard Pogge, Hopewell Junction, N.Y.; Johann Greschner, Pliezhausen, Germany; Howard Leo Kalter; Raymond James Rosner, both of Colchester, Vt.

[73] Assignee: International Business Machines Corporation, Armonk, N.Y.

[21] Appl. No.: 497,498

[22] Filed: Jun. 30, 1995

[51] Int. Cl.⁶ .......................... H01L 23/48; H01L 23/52
[52] U.S. Cl. ...................... 257/506; 257/510; 257/513; 257/622; 257/684; 437/67; 437/78; 437/79
[58] Field of Search ................... 257/734, 774, 257/506, 510, 513, 520, 622, 684; 437/61, 67, 78, 79

[56] References Cited

U.S. PATENT DOCUMENTS

| | | | |
|---|---|---|---|
| 4,489,364 | 12/1984 | Chance et al. | 361/395 |
| 4,542,397 | 9/1985 | Biegelsen et al. | 357/32 |
| 4,670,770 | 6/1987 | Tai | 357/60 |
| 4,783,695 | 11/1988 | Eichelberger et al. | 357/65 |
| 4,884,122 | 11/1989 | Eichelberger et al. | 357/71 |
| 4,933,042 | 6/1990 | Eichelberger et al. | 156/239 |
| 4,949,148 | 8/1990 | Bartelink | 357/74 |
| 4,954,875 | 9/1990 | Clements | 257/774 |
| 4,967,146 | 10/1990 | Morgan et al. | 324/158 R |
| 5,019,535 | 5/1991 | Wojnarowski et al. | 437/209 |
| 5,023,205 | 6/1991 | Reche | 437/228 |
| 5,034,091 | 7/1991 | Trask et al. | 156/643 |
| 5,091,330 | 2/1992 | Cambou et al. | 437/62 |
| 5,168,344 | 12/1992 | Ehlert et al. | 257/693 |
| 5,207,866 | 5/1993 | Lue et al. | 156/647 |
| 5,229,647 | 7/1993 | Gnadinger | 257/774 |
| 5,331,203 | 7/1994 | Wojnarowski et al. | 257/698 |
| 5,353,498 | 10/1994 | Fillion et al. | 29/840 |
| 5,355,102 | 10/1994 | Kornrumpf et al. | 333/33 |
| 5,373,627 | 12/1994 | Grebe | 29/841 |

OTHER PUBLICATIONS

M. Gdula, et al, "A 36–Chip Multiprocessor Multichip Module with the General Electric High Density Interconnect Technology" IEEE, V. 91, pp. 727–730, 1991. No month.

H. Linde, et al, "Wet Silicon Etching with Aqueous Amine Gallates" Jrl. Electrochemical Soc., V. 139, #4, pp. 1170–1174, Apr. 1992.

Marketing Materials, "High Density Multichip Interconnect—Reliability Data" Hughes Microelectronic Circuits Division, A subsidiary of GM Hughes Electronics, Newport Beach, CA, 3 pages, post 1992. No month.

R. J. Wojnarowski, et al, "Three Dimensional Hybrid Wafer Scale Integrateion Using the GE High Density Interconnect Technology" IEEE Conference on Wafer Scale Integration, Session 7, WSI Technology 1, p. 309–316, 1993. No month.

M. Despont, et al, "New Design of Micromachined Capacitive Force Sensor" Jrl. of Micromechanics & Microengineering V. 3, #4, pp. 239–242, Dec. 1993.

D. Sander, et al, "Fabrication of Metallic Microstructures by Electroplating Using Deep–Etched Silicon Molds" IEEE, Jrl. of Microelectromechanical Systems, V. 4, #2, pp. 81–86, Jun. 1995.

J. W. Bartha, et al, "Low Temperature Etching of Si in High Density Plasma Using SF6/02" Microelectric Engineering 27, pp. 453–456, 1995. No month

*Primary Examiner*—Sara W. Crane
*Assistant Examiner*—David Ostrowski
*Attorney, Agent, or Firm*—Susan M. Murray; Joseph P. Abate

[57] ABSTRACT

Disclosed is an integrated circuit configuration including a carrier having recesses for supporting individual semiconductor die units. The semiconductor die units and the carrier recesses have lithographically defined dimensions so as to enable precise alignment and a high level of integration.

14 Claims, 10 Drawing Sheets

VERY DENSE INTEGRATED CIRCUIT PACKAGE

FIELD

This invention relates to an integrated circuit packaging configuration and more particularly relates to a high-density integrated circuit packaging configuration.

BACKGROUND

As advances in semiconductor processing occur, the scale of individual integrated circuit devices continues to shrink, making it possible to incorporate increasing amounts of functionality in a single integrated circuit chip. For example, sixteen 1 MBIT Dynamic Random Access Memory (DRAM) chips of equal size in 1984 required a total chip area of 800 mm$^2$, while a single 16 MBIT design containing the same functionality in 1990 required only 110 mm$^2$. Thus, although the individual chip size has increased by approximately 50%, the net chip area has been reduced by a factor of 8. Accordingly, as integrated circuit chips are required to incorporate more and more functionality, the size of the chips has been steadily increasing.

However, there are practical problems associated with continually increasing the maximum chip size. A first set of problems relates to the physical limits of present day fabrication equipment. For example, state-of-the-art manufacturing lithography equipment commonly used to expose high resolution patterns through masks onto semiconductor substrates effectively limits chip size to the size of the lithography exposure field of the equipment. The size of the direct exposure field of state-of-the-art manufacturing lithography equipment in the mid 1990s is generally on the order of 18 mm in diameter, allowing square chip design exposure of about 144 mm$^2$ (12 mm×12 mm). Most DRAM chip designs in development are rectangular and tend to be 20 mm×10 mm, or larger. While a mask larger than the lithography exposure field of the equipment can be split into multiple smaller masks that are "stitched" together to effectively multiply the size of the lithography exposure field, such "stitching" introduces undesired inaccuracies and occupies valuable space on the semiconductor substrate. A solution to the exposure field/stitching problem is to develop fabrication equipment having a larger exposure field and, therefore, the capability to manufacture larger chips without stitching masks together. However, such a solution would require massive financial investment in research and development.

Additionally, in order for a wafer to produce a large enough number of chips to make the manufacturing of larger chips practical, semiconductor wafers would need to migrate to a larger size, thereby requiring further substantial investment in the development of new crystal pulling equipment, and wafer processing and handling equipment.

Another problem relates to the general trend of wafer yields decreasing with increasing chip size. FIG. 1 summarizes different manufacturing chip yields as a function of the chip edge dimension (square chips). It will be observed that as the chip area increases, the effective chip yields reduce nearly linearly. The different curves relate to different design complexities, with the topmost curve being the least complex and the bottommost curve being the most complex of the three exemplary curves. The decrease in yield with increasing chip size can be attributed to the fact that for the same quality of semiconductor, any defect existing in a larger chip results in an overall greater area waste than is the case with smaller chip wafers. As chip size increases, the cost of manufacturing due to yield degradation becomes prohibitive.

Conventional multi-chip modules (MCM's) avoid the problems associated with producing large chips by combining a plurality of small-sized chips in a larger package. For example, U.S. Pat. No. 4,489,364, assigned to IBM, discloses a ceramic chip carrier for supporting an array of chips by means of solder balls. However, such MCMs tend to be extremely expensive due to their multilayered ceramic features and they require significantly more area than the net overall area of the combined set of chips.

Other similar approaches include the High Density Interconnect (HDI) structure proposed by the General Electric Company and generally described in IEEE magazine, 1991, "A 36-Chip Multiprocessor Multichip Module made with the General Electric High Density Interconnect Technology". However, the HDI technology offers poor positional accuracy of chips, preventing the use of a fixed mask to make chip-to-chip connections, and thereby making the process of interconnecting individual chips extremely time consuming and expensive.

What is needed is a new integration scheme for combining, in close proximity, a plurality of semiconductor die units.

OBJECTS OF THE INVENTION

It is an object of the present invention to provide a semiconductor die unit having precise dimensions.

It is a further object of the present invention to provide a very dense integrated circuit package and a method for forming the same.

It is a still further object of the present invention to provide a very dense integrated circuit package in which semiconductor die units having lithographically determined dimensions are supported by a semiconductor carrier, and to provide a method of forming the same.

It is a still further object of the present invention to provide a very dense integrated circuit package in which semiconductor units having lithographically determined dimensions are supported in close proximity to each other by a semiconductor carrier, and to provide a method for forming the same.

BRIEF DESCRIPTION OF DRAWINGS

The foregoing and other objects, aspects and advantages will be better understood from the following detailed description with references to the drawings, in which:

FIGS. 2E', 2F' and 2G' depict alternate steps for a portion of the method depicted in FIGS. 2A through 2G.

SUMMARY OF THE INVENTION

In a first aspect of the invention, a semiconductor die unit includes a semiconductor substrate in which semiconductor devices are formed, and at least one metallization layer, the outer dimensions of the semiconductor die unit being defined lithographically.

In another aspect of the invention, a carrier for supporting semiconductor die units includes a substrate having lithographically defined recesses for receiving the semiconductor die units.

In still another aspect of the invention an assembly comprises a carrier supporting in its recesses one or more semiconductor die units and having additional metallization layers for forming connections between semiconductor die units.

In further aspects of the present invention methods for forming the semiconductor die unit, the carrier and the assembly are disclosed.

DETAILED DESCRIPTION OF PREFERRED EMBODIMENT

Figure 1:
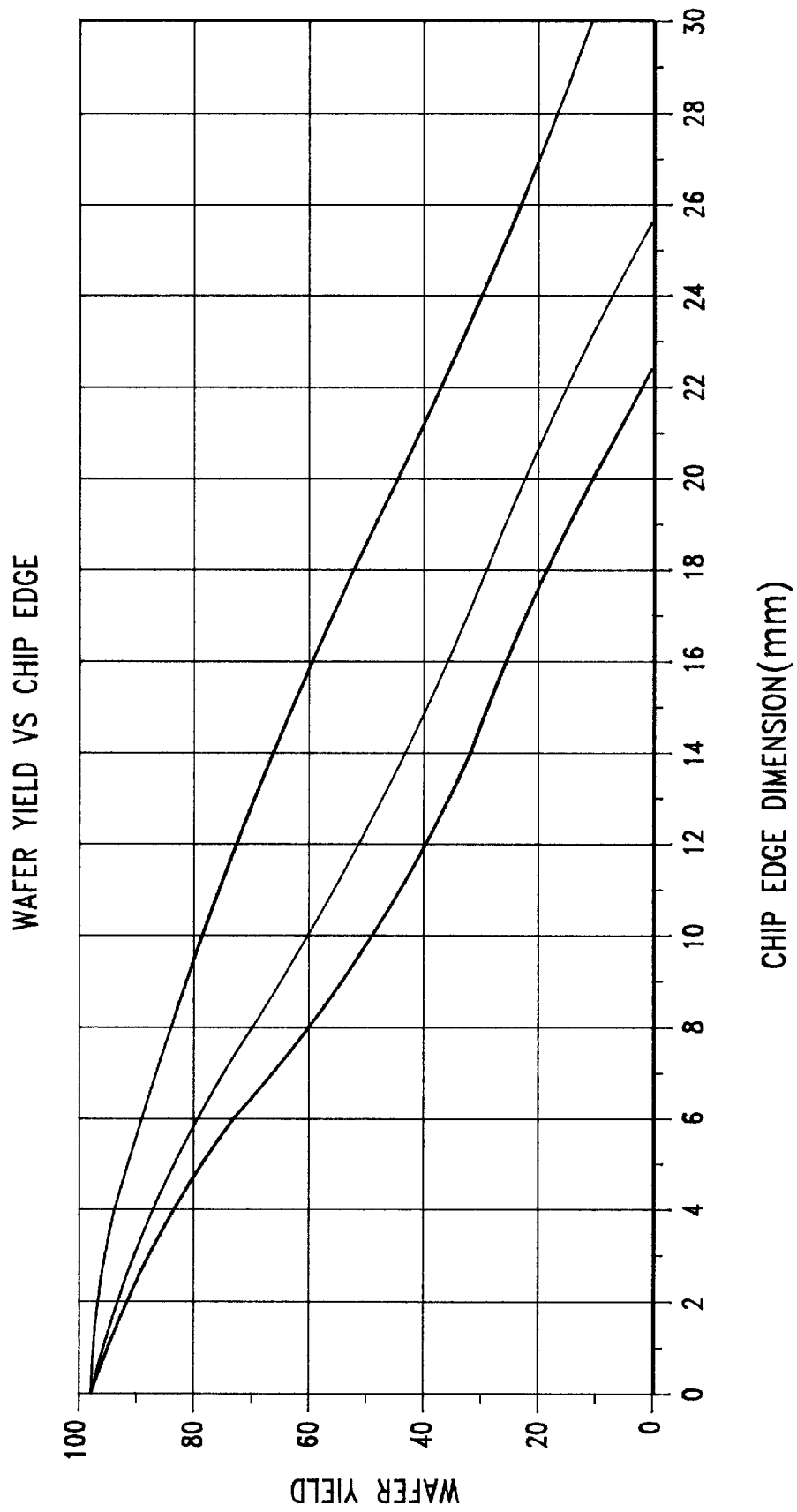
FIG. 1 is a graph depicting wafer yield as a function of chip edge dimension for square chips formed from a wafer 125 mm in diameter.
Figure 2A:
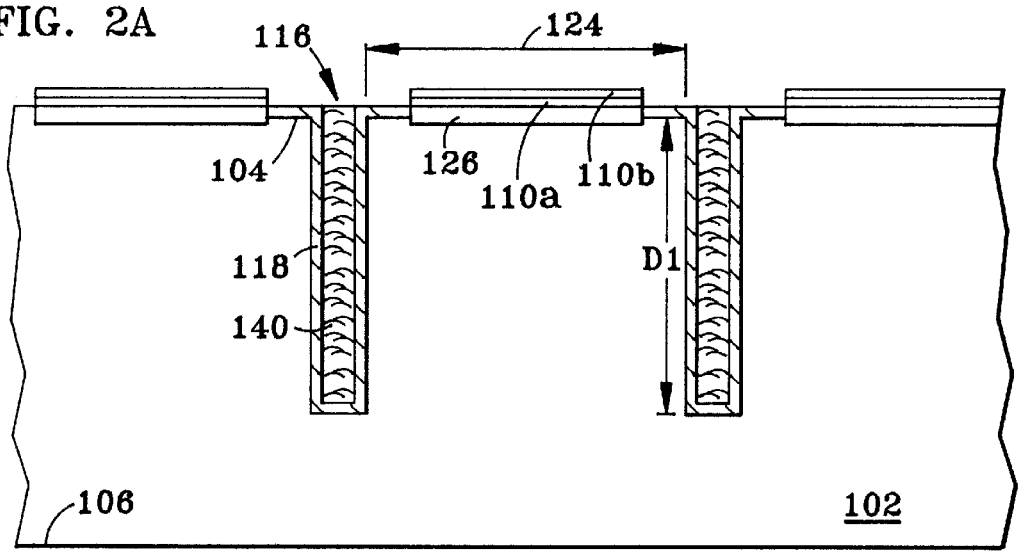
FIGS. 2A through 2G depict a method of forming a lithographically defined semiconductor die unit.

With reference to FIGS. 2A through 2G, a preferred method of forming a semiconductor die unit, for example a chip, will now be described. Shown in FIG. 2A is a semiconductor substrate 102 (e.g. a wafer) having an active surface 104 and a passive surface 106. The active surface 104 is generally the side of the substrate on which electronic devices will be later formed, and substrate 102 has at least one designated active area 124 for that purpose. The semiconductor substrate may be silicon, germanium, gallium arsenide, CdSe, a compound of a Group II element and a group VI element, of a compound of a Group III element and a group V element.

A deep trench 116 is formed around designated active areas 124 and extends from the active surface 104 into the body of the semiconductor substrate 102 to a depth D1. The deep trench generally serves the purpose of precisely defining the perimeter area dimensions, and the thickness of the semiconductor die unit to be formed, as will be discussed in further detail below. For purposes of clarity, FIG. 2A only shows a single complete active area 124, but the invention includes a plurality of active areas 124, each of which is defined and separated by the deep trenches 116.

Figure 3:
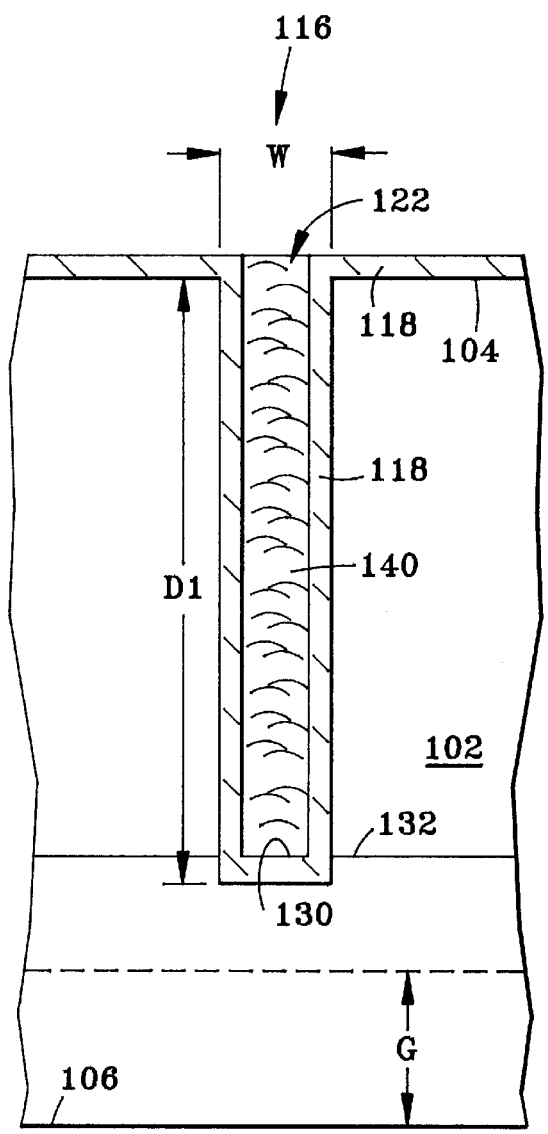
FIG. 3 is a more detailed diagram of a deep trench depicted in FIGS. 2A through 2F, 2E' and 2F'.

FIG. 3 is a more detailed diagram of a deep trench 116. With reference to FIG. 3, the aspect ratio of the deep trench, that is the ratio of the depth D1 to the width W, is generally on the order of 5:1, but can vary greatly according to the available etching capabilities, the desired thickness (~D1) of the finished semiconductor die unit (not shown), and the number of semiconductor die units per substrate. For example, the depth D1 of the deep trench may be on the order of 150 micrometers, while the width can be on the order of 10–30 micrometers. However, the invention is not limited to such exemplary dimensions or the ratio between them.

The deep trench 116 is formed by anisotropic plasma etching, and, for silicon substrates, preferably by cryogenic etching, as disclosed by Bartha et al in "Low temperature etching of Si in high density plasma using $SF_6/O_2$", Microelectronic Engineering, Vol. 27, pages 453–456, 1995, incorporated herein by reference. As, disclosed, cryogenic etching involves plasma etching silicon at temperatures of −110° C. and at pressures in the 1 Pa range using $SF_6$ gas. The desired aspect ratio can be realized with the appropriate addition of $O_2$ in the $SF_6$ gas. For example, a gas ratio of $O_2$ to $SF_6$ of about 1:10 realizes an anisotropically etched trench with depths of over 150 micrometers. The specific etch characteristics are influenced by the pattern density of the wafer to be etched. Hence, appropriate adjustments are needed with changes in pattern designs.

With continued reference to FIG. 3, after the deep trench 116 is formed, it is lined with a polish stop material 118. The lining 118 preferably coats the entire interior surface of the trench, including the bottom surface 130 of the trench 116. A substantially uniform trench lining 118 can be achieved in the temperature range of about of 600°–900° C. when depositing $Si_3N_4$ with a chemical vapor deposition (CVD) technique. Other materials (mainly nitrides, carbides or certain oxides) can also be used. Also, FIG. 3 shows polish stop material 118 on the active surface 104, so as to serve as a mask for subsequent device processing, if desired. The thickness of the lining is preferably thicker than 2000 Å.

After the deep trench 116 is lined with a suitable polish stop material 118, the remaining space of the deep trench 116 is filled or closed off. The closing off of the deep trench 116 is preferably performed by filling the deep trench 116 with a suitable material 140 as shown. However, the deep trench 116 need not be entirely filled as long as the opening 122 near the active surface 104 is blocked to form a nearly planar surface with the active surface 104. Suitable filling materials preferably include materials capable of withstanding further semiconductor processing conditions and having: 1) etch properties dissimilar to that of the semiconductor substrate 102 and; 2) a coefficient of thermal expansion preferably similar to that of the semiconductor substrate 102. For example, if the semiconductor substrate 102 is silicon, suitable materials for closing off the deep trench 116 generally include polycrystalline or amorphous silicon and most dielectrics, for example, silicon dioxide, borosilicate glass (BSG), and borophosphosilicate glass (BPSG).

Next, returning to FIG. 2A, the semiconductor substrate 102 is further processed so as to fabricate integrated circuit devices generally indicated at 126 within the active area 124 defined by the deep trenches 116. The fabrication methods may vary with the type of integrated circuit devices desired, for example, bipolar, CMOS, biCMOS etc. While the type of integrated circuit technology and, therefore, the fabrication method, is one of design choice, as was noted above, the choice of material for closing off the deep trenches 116 depends upon the subsequent device fabrication method used. For example, many CMOS processes raise the temperature of the substrate to as high as 700° C., and use a variety of etchants such as $CHF_3$, $CF_4$, $BF_3$, etc. In such a case, the material used to close off the deep trench should preferably be capable of withstanding the thermal and chemical requirements of the CMOS process without degrading substantially, for example, polycrystalline silicon. Alternatively, the additional film layers used in the subsequent device fabrication method can also serve as additional capping material over material 140, thereby relaxing the requirements placed on material 140.

With continued reference to FIG. 2A, after devices 126 have been formed in the active areas 124, local metallization is provided. Conventional metallization techniques may be used. A first metallization layer 110a is deposited over the active areas 124 to selectively form connections between devices 126 within the same active area 124. Preferably, additional metal layers 110b, sufficient for enabling the testing of the finished semiconductor die unit (not shown), are also deposited at this step. Such testing preferably provides the ability to screen out defective semiconductor die units after testing and prior to incorporating them into a larger package, thereby enhancing overall yield of the ultimate assembly.

Figure 2B:
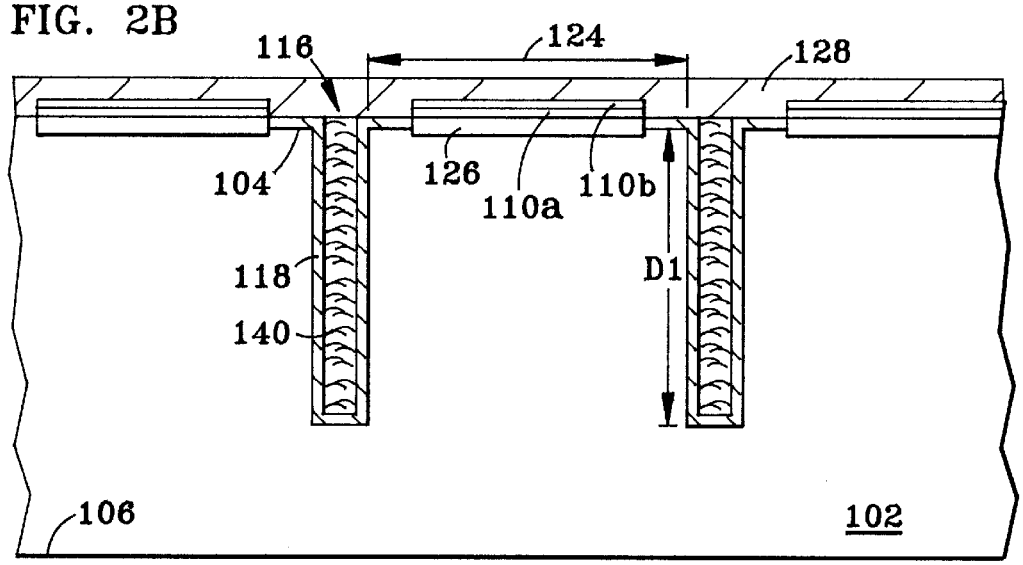

With reference to FIG. 2B, after local metallization and testing, the active surface 104 of the semiconductor substrate 102 is coated with a protective layer 128 to shield the active areas 124 during further processing. The protective layer 128 preferably comprises one of many polymers (for example, polyimide), which are readily applied, are surface conformal, have adequate thickness (~1–5 $\mu$m), and can withstand subsequent processes.

Figure 2C:
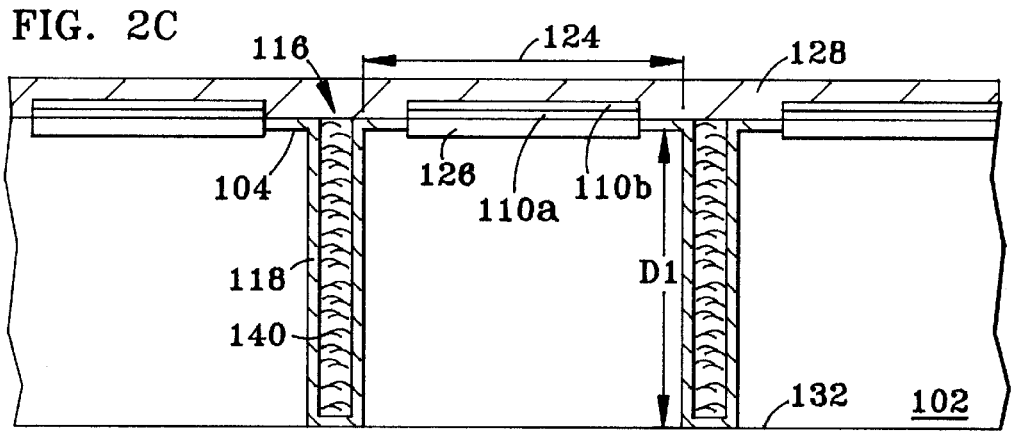

With reference to FIGS. 2C and 3, after the protective layer 128 is placed on the active surface 104, the passive surface 106 of the substrate 102 is first ground away preferably to within approximately 10–100 $\mu$m micrometers of the bottom 130 of the deep trench 116. The portion of the substrate 102 to be removed by grinding is generally indicated by the dimension "G" in FIG. 3. Then the substrate 102 is polished up to or past the bottom surface 130 of the polish stop lining 118 of the deep trench 116, such that the bottom surface 130 of the polish stop lining 118 is flush with or protrudes slightly above the polished surface 132. The polishing step is preferably performed by chemical-mechanical polishing methods for removing silicon as are known in the art, an example of which is described by U.S. Pat. No. 5,091,330, to Cambou et al, incorporated herein by reference.

With reference to FIGS. 2D through 2G, the creation of reference features 136 proximal to the polished surface 132 will now be described. While, for purposes of clarity, the reference features described have a particular geometry, a person of ordinary skill in the art will recognize in light of the following disclosure that a wide variety of geometries would be in the spirit and scope of the invention. Furthermore, the preferred method of forming the reference features 136 is by crystallographic orientational selective etching, but other methods may be employed, for example, plasma etching.

In order to employ crystallographic orientation selective etching, the substrate 102 is chosen to have a particular crystalline orientation. For example, in FIGS. 2A through 2F the semiconductor substrate 102 can be a (100) semiconductor wafer; that is, a semiconductor wafer having a top surface aligned with the (100) crystalline plane. Thus the (100) plane is used as the active surface 104 of the semiconductor substrate 102. The following discussion describes the reference features 136 (see FIG. 2E) formed for a (100) semiconductor wafer, but reference features of varying shapes can be formed when using wafers of other orientations, (for example a (110) wafer), or other etching techniques.

Figure 2D:
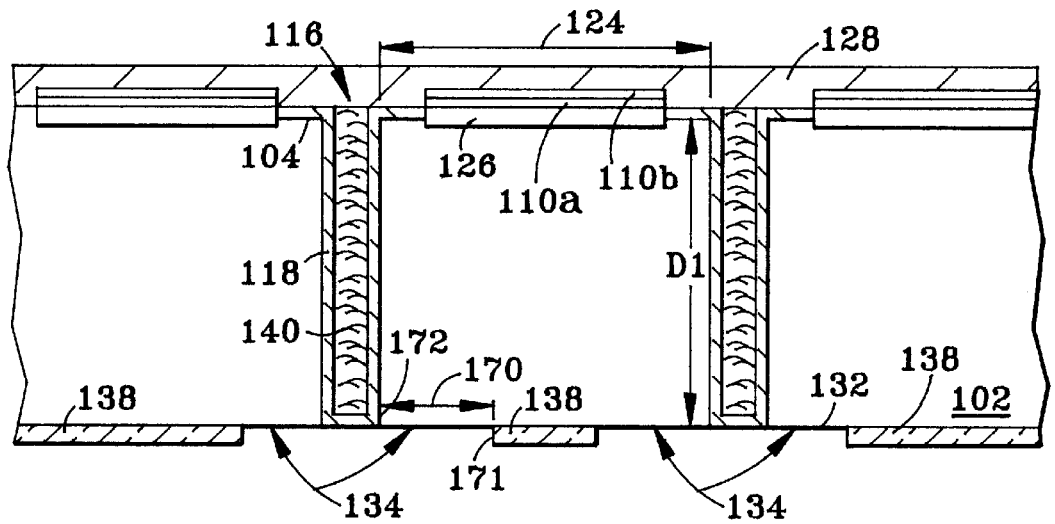

First, with reference to FIG. 2D, a photosensitive masking layer 138 is deposited over the polished surface 132 and, using the trench bottom 130 for alignment references, is patterned such that areas 134 of polished surface 132, which are immediately adjacent the deep trenches 116, are exposed (e.g. made susceptible to further etching). The patterning can be performed by conventional lithographic methods.

Figure 2E:
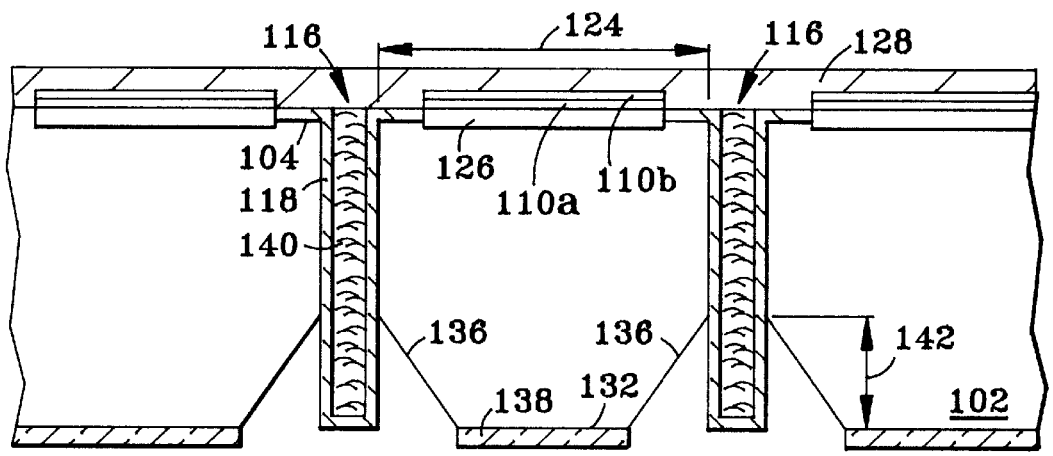

Next, with reference to FIG. 2E, the photosensitive masking layer 138 is used as a mask to anisotropically wet etch the substrate 102 in the areas 134. Wet anisotropic etchants can be used, such as potassium hydroxide (KOH), hydrazine, quaternary ammonium hydroxides, and ethylenediamine solutions, as disclosed in the Journal of the Electrochemical Society (JECS), Vol. 139, No. 4 April 1992, pages 1170–1174, which is herein incorporated by reference. These etchants, due to their anisotropic nature, have differential etch rates for different crystallographic planes, thereby creating a tapered reference feature 136, as shown in FIG. 2E.

The geometric dimensions of the areas 134 have the important function of controlling the formation of reference features 136. The final geometric dimensions of reference feature 136 will be dictated by the distance 170 between the edge 171 of the patterned photosensitive masking layer 138 and the edge 172 of the liner etch stop 118. Since the silicon etch is anisotropic, it becomes self limiting, once the full (111) crystal surface is exposed. Thus, by controlling the distance 170 (FIG. 2D), the depth 142 (FIG. 2E) will be defined by the crystallographic relationship of the (111) surface for a (100) type silicon wafer to form reference features 136.

Figure 2F:
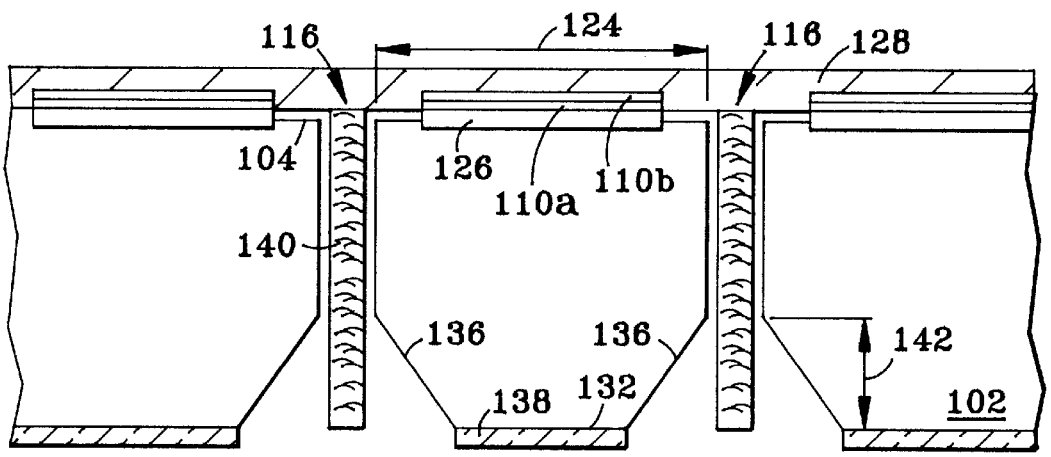

Finally, with reference to FIG. 2F, the substrate 102 is exposed to a selective wet etch or a plasma etch, such as RIE, to selectively etch the etch stop liner 118, thereby removing the liner 118. For example, if the etch stop liner 118 is silicon dioxide, a suitable etchant would be HF; if the etch stop liner 118 is $Si_3N_4$, the etchant can be hot phosphoric acid. Subsequent chemical removal of material 140 (see FIG. 3) and protective layer 128 finally separates individual semiconductor die units 150 as shown in FIG. 2G.

Figure 2G:
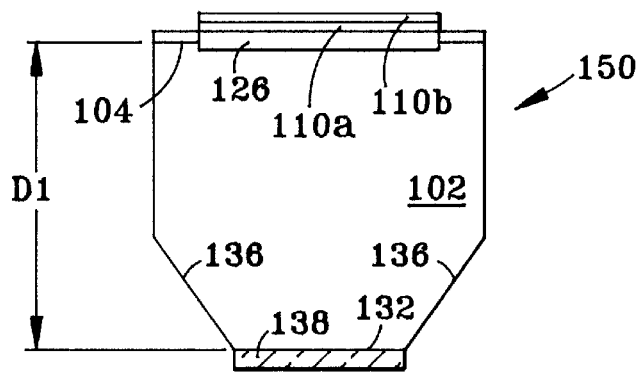
Figure 2E:
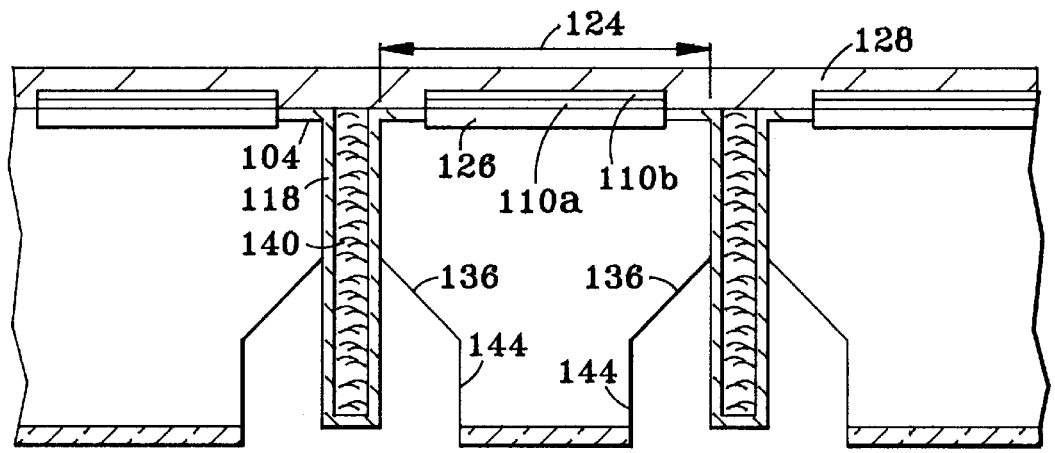
Figure 2F:
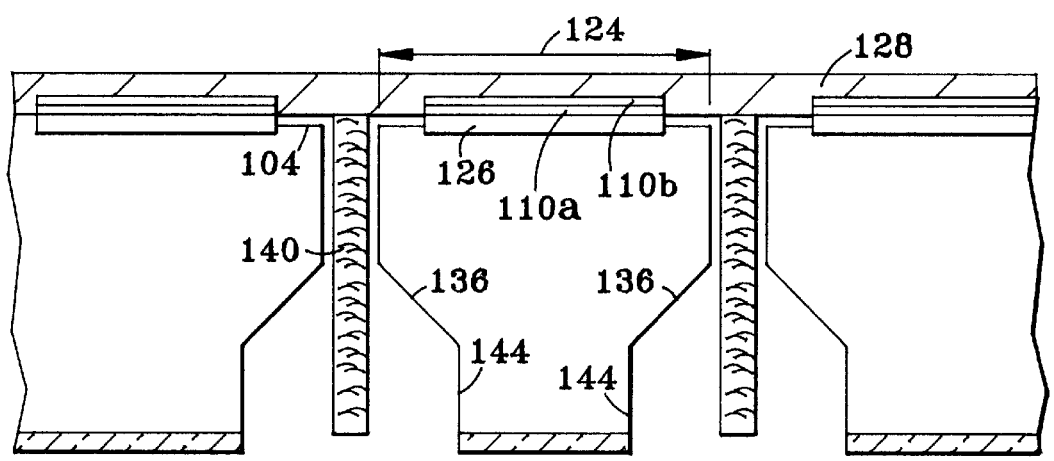
Figure 2G:
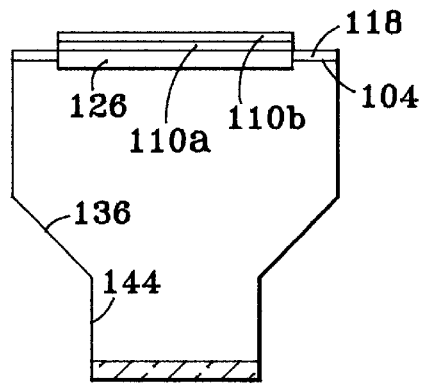

Alternatively, the semiconductor die unit geometry could take on any number of different forms by altering the steps depicted in FIGS. 2E through 2G, an example of which is shown in FIGS. 2E' through 2G'. For example, the structure shown in FIG. 2E' may be formed when the structure shown in FIG. 2E is subjected to an anisotropic plasma etch, such as by cryogenic etching, so as to translate the reference feature 136 to a deeper position, while a vertical surface 144 is created, as shown in FIG. 2E'. Subsequent selective wet etching of liner material 118 (FIG. 2F') and chemical etching of material 140 and protective coating 128 will result in the die shape shown in FIG. 2G'. Various shapes other than those shown in FIG. 2G' can also be generated using different etchants or different etching conditions.

Figure 4A:
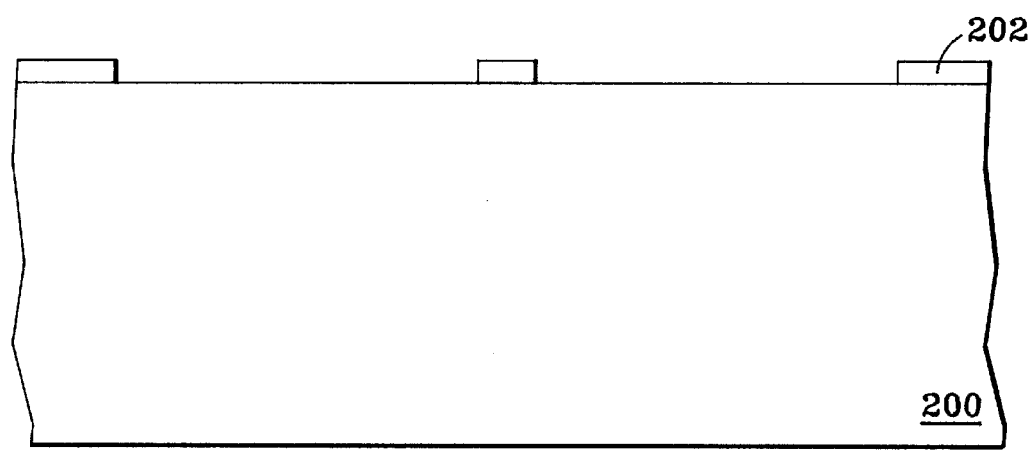
FIGS. 4A through 4C depict a method of forming a semiconductor carrier for holding semiconductor die units.
Figure 4B:
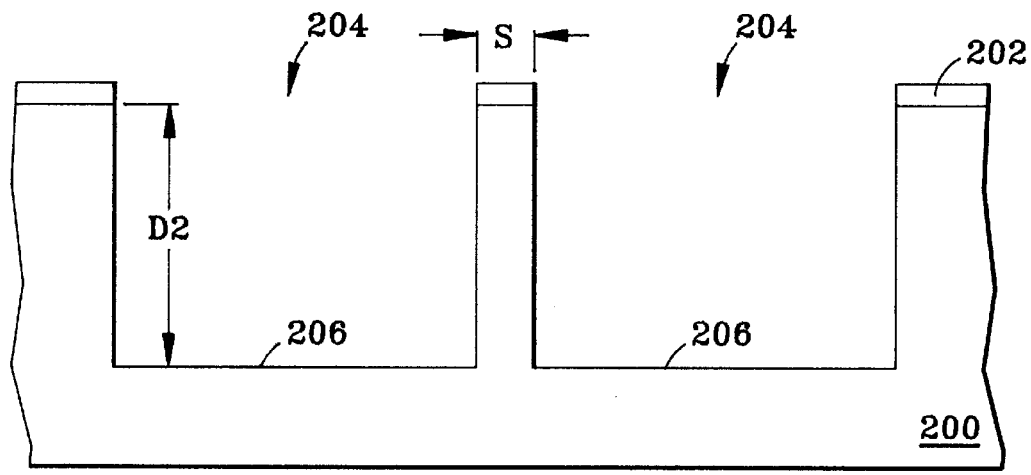
Figure 4C:
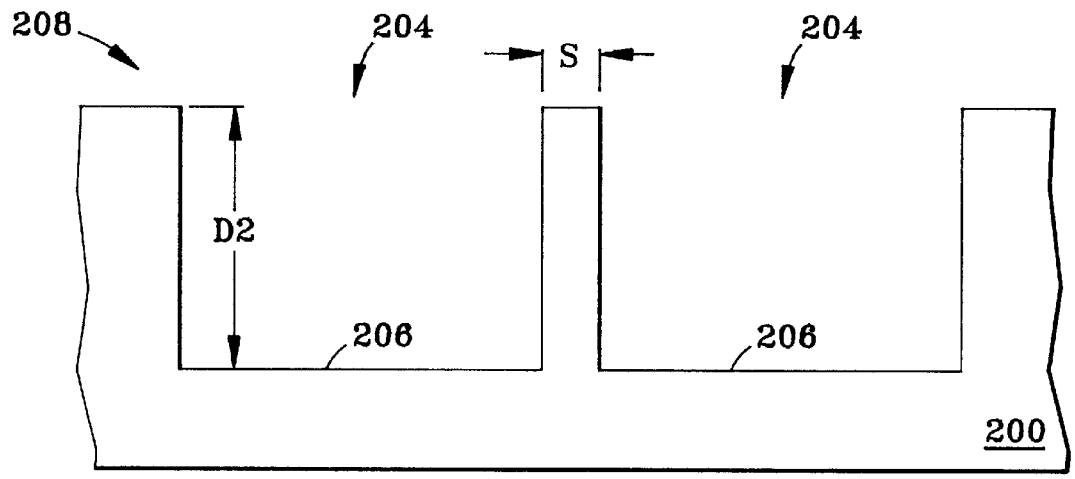

With reference to FIGS. 4A through 4C, a method for forming a carrier for holding a plurality of semiconductor die units will now be described. First a substrate 200 is provided. The substrate is preferably crystallographic and more preferably a semiconductor, such as silicon, germanium, gallium arsenide, CdSe, a compound of a Group II element and a group VI element, or a compound of a Group III element and a group V element. The carrier substrate 200 preferably has a crystallographic orientation and a thermal coefficient of expansion similar to those of the semiconductor die units to be held. More preferably, the carrier substrate 200 is the same material as the semiconductor substrate 102 of the semiconductor die units 150.

With reference to FIG. 4A, using standard lithographic methods, a masking layer 202 (e.g. $SiO_2$) may be deposited and patterned. After patterning, the semiconductor substrate 200 may be anisotropically etched, using conventional methods and more preferably, cryogenically reactive ion etched, to form recesses 204 as is shown in FIG. 4B. The recesses 204 are etched to a desired depth D2 and are sized to receive semiconductor die units 150. The depth D2 will depend in part upon the thickness of the semiconductor die units 150 (as controlled by deep trench depth D1) to be held and may vary according to alternate embodiments of the invention as will be described in further detail below. The spacings S between recesses 204 in FIG. 4B are preferably in the approximate range of 20–300 micrometers and are more preferably less than 50 micrometers. The lower value of S is dictated by the mechanical strength of the substrate material 200 in relation to the depth of the recesses 204. The upper value of S, although not restricted to 300 micrometers, is defined by wiring width and wire spacing requirements. Wiring width and wire spacing requirements generally depend upon wiring width capabilities, the desired wiring interconnect density, and current carrying load requirements. Generally, 300 micrometers would satisfy most present day wiring width and spacing requirements, but the dimension could readily vary on either side of 300 micrometers. FIG. 4C shows a completed carrier 208 after removal of the masking layer 202.

Optionally, reference features 336 may be formed near the bottom 306 of the recesses 304, as shown in FIGS. 5A through 5D, in which similar reference numerals indicate elements similar to those of FIGS. 4A through 4C. The reference features 336 aid alignment between the carrier 308 and the semiconductor die units 150, and are shaped and located to afford a cooperative arrangement with the reference features 136 in FIG. 2G of the semiconductor die units 150. The reference features 336 are preferably formed by crystallographic orientational etching as will now be described in more detail.

Figure 5A:
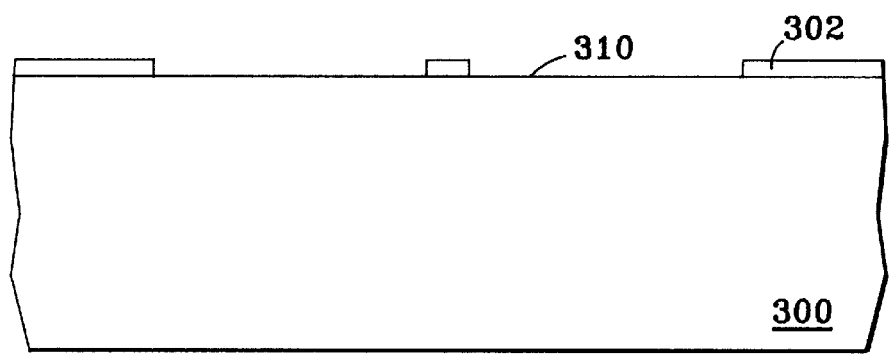
FIGS. 5A through 5D depict a method of forming a semiconductor carrier for holding semiconductor die units, the semiconductor carrier having tapered sidewalls.
Figure 5B:
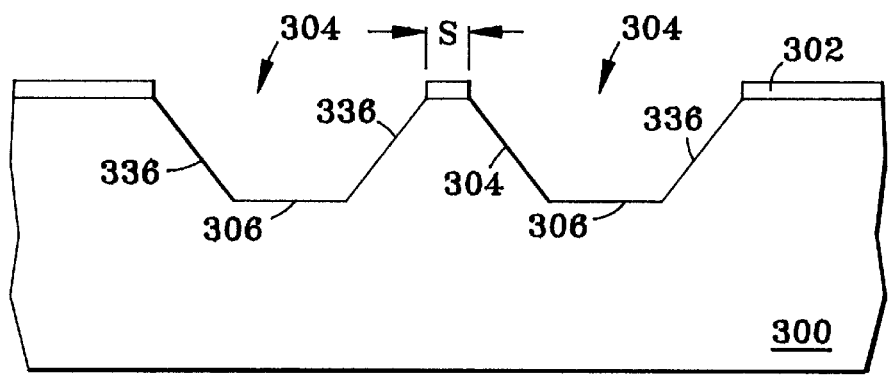
Figure 5C:
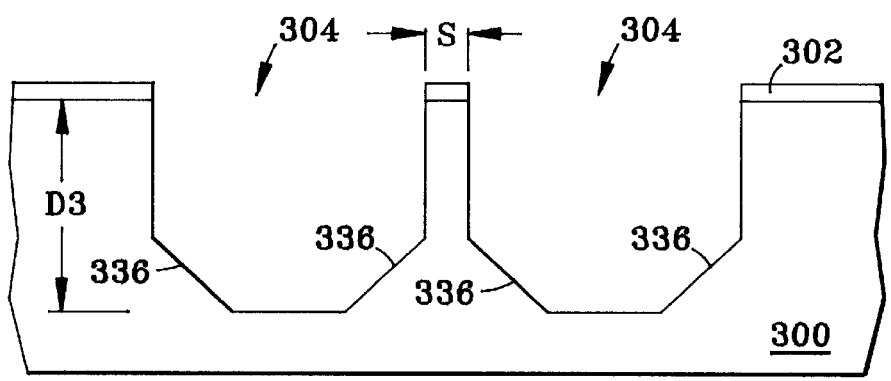
Figure 5D:
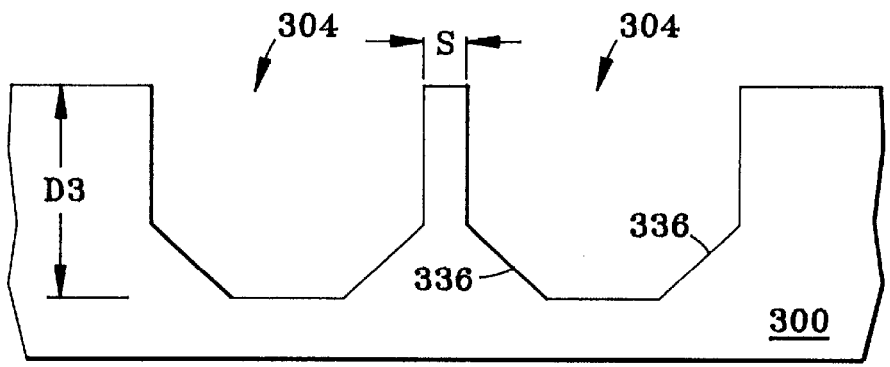

For crystallographic orientational etching of reference features 336, the semiconductor substrate 300 comprises a (100) semiconductor wafer, that is, a semiconductor wafer having a top surface aligned with the (100) crystalline plane. Thus, with reference to FIG. 5A, the (100) plane corresponds to the top surface 310 of the substrate 300. With respect to FIGS. 5A and 5B, the steps of depositing and patterning a masking layer 302 are similar to the steps described above with reference to FIGS. 4A and 4B. However, the recesses 304 formed in FIG. 5B are slightly oversized with respect to the semiconductor die unit to be held. With reference to FIG. 5B, an anisotropic etch, such as KOH, hydrazine, quaternary ammonium hydroxides, and ethylenediamine solutions, is used to leave a tapered recessed region 304 with (111) surfaces 336. Transferring the substrate 300 to a cryogenic plasma etcher, the 336 surfaces and surface 306 are further etched to translate the reference features 336 deeper into the carrier substrate 300, realizing FIG. 5C. The depth D3 is approximately equivalent to the thickness D1 of the die 150. FIG. 5D shows the carrier 308 without the masking layer 302.

Figure 6A:
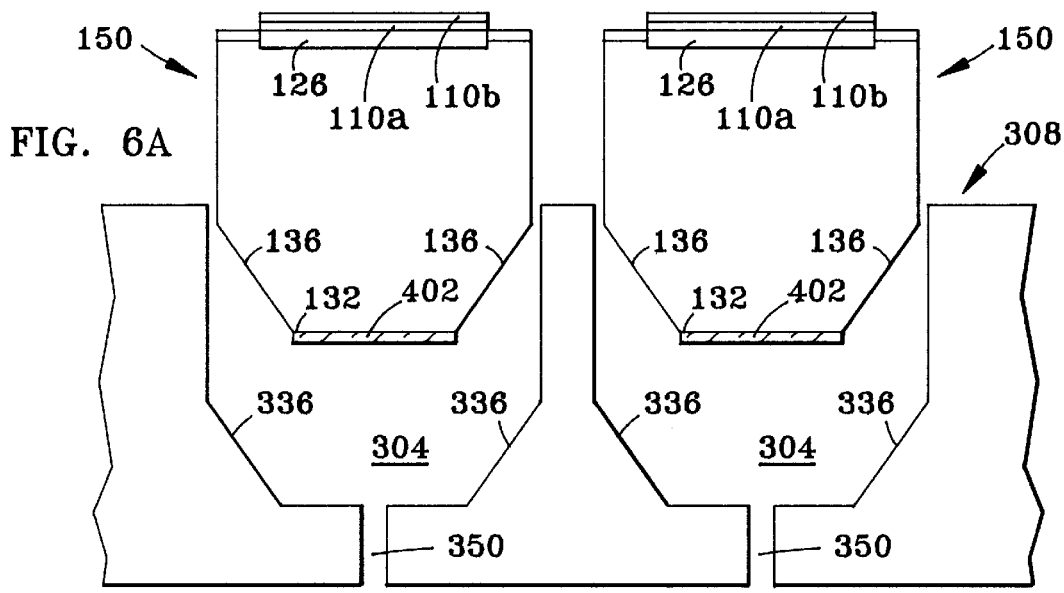
FIGS. 6A through 6C depict an assembly of the semiconductor die unit of FIG. 2G and the semiconductor carrier of FIG. 5D.
Figure 6B:
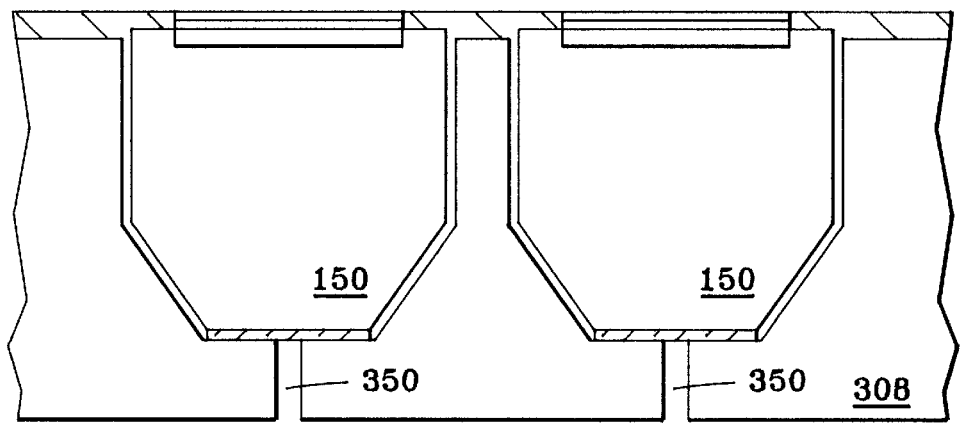
Figure 6C:
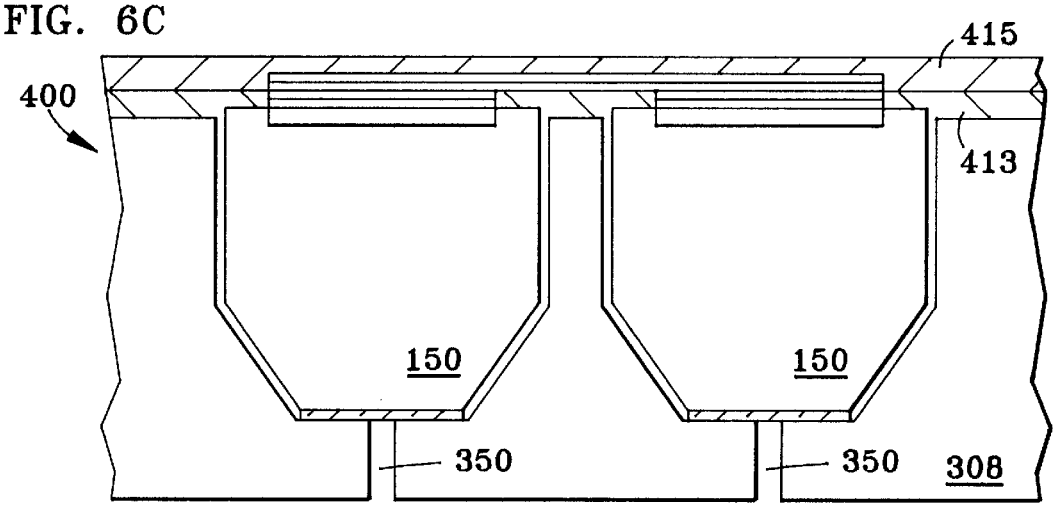

With reference to FIGS. 6A through 6C, the assembly of semiconductor die units 150 into the carrier 308 to form the final integrated package 400 will now be described. It should be noted that the semiconductor die units 150 which are assembled into the carrier 308 may be formed from substrates of similar or dissimilar materials, and the processing methods to form the devices 126 in the semiconductor die units 150 may have been radically different.

An appropriate surface binder 402 is preferably first applied to the polished surface 132 (FIG. 2G) of the semiconductor die units. For example, polyimide may be applied at a temperature of 100° C. by standard application methods. Alternatively, a spray coating can be used. Or, the masking layer 138 (see FIG. 2G) may be retained on the polished surface 132 provided it has the appropriate binder properties. The binder material may also have thermally conductive properties to allow heat transmission.

The semiconductor die units 150 are then placed in the recesses 304 such that the metallization layers 110a and 110b are facing up. Conventional chip placement tools, such as vacuum probes may be used. The die units to be placed into the recesses will be given the appropriate orientation by having them aligned with the help of an orientator. The die units can be placed into an inclined hopper and can slide into a corner serving as an orientation reference point. Once the die unit 150 is properly oriented, a robotically controlled vacuum probe will place the die units 150 into recesses 304 of carrier 308, the orientation of which has been similarly aligned. Once in place, the chips are mechanically agitated to drop fully into the recesses 304. If required, assistance of an optical flat platen can be used to assure complete insertion into recesses 304.

If the semiconductor die units 150 and the carrier recesses 304 have respective reference features 136 and 336, formed by crystallographic orientational etching as described above, the semiconductor die unit 150 and carrier 308 are substantially self-aligning to each other, thereby easing insertion and some dimensional tolerances while still producing a precise result.

Optionally, one or more pressure relief holes 350 (not to scale) can be drilled through the carrier 308 from the bottom 310 of the carrier 308 to surface 306, preferably prior to assembly, in order to relieve pressure created by trapped gases. Suitable drilling techniques include laser ablation, ion beam milling or cryogenic plasma etching.

Figure 7A:
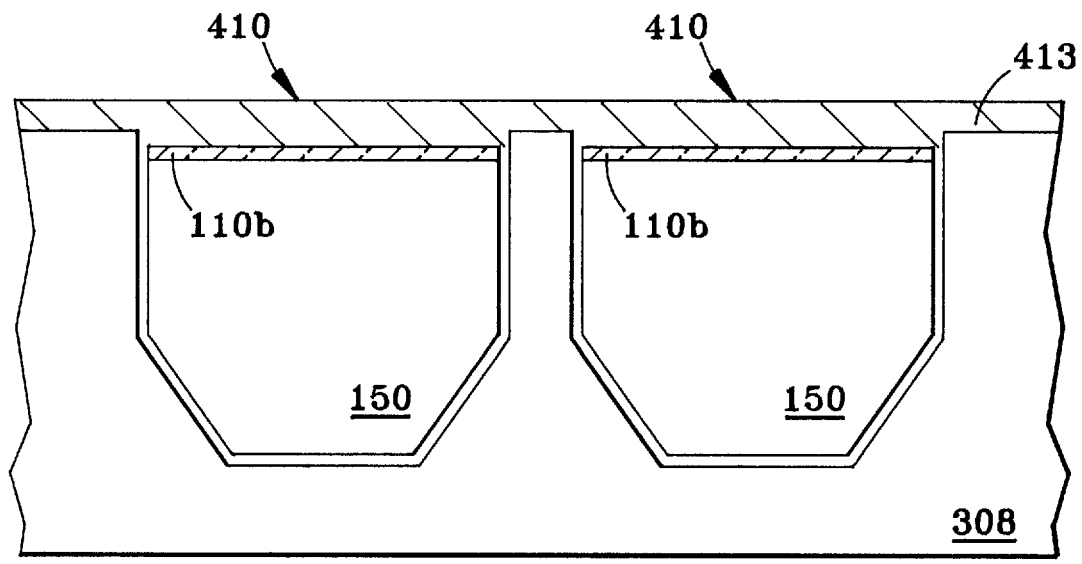
FIGS. 7A and 7B depict leveling off of a carrier and its semiconductor die units when the upper surfaces are not substantially flush.
Figure 7B:
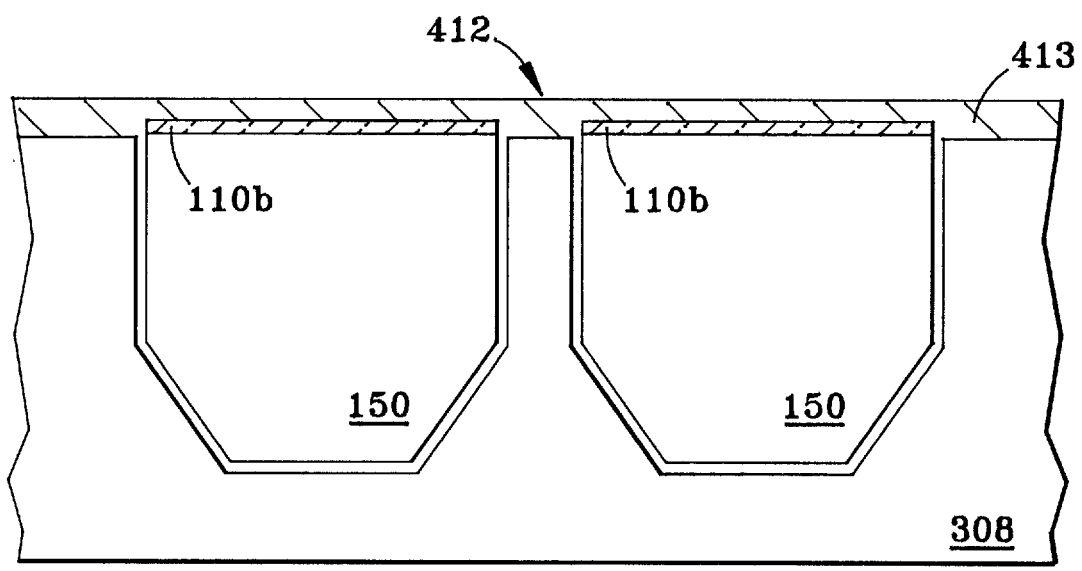

With reference to FIGS. 7A and 7B, to the extent the upper metallization layer 110b of the semiconductor die units 150 is not substantially flush with the top surface 408 of the carrier, it is desirable to fill in low-lying areas 410 (FIG. 7A) or 412 (FIG. 7B) with an additional binder material 413, for example, spin-on glass (SOG) or polyimide (PI), utilizing standard spin-on and bake techniques, while also filling in any gaps between die unit 150 and carrier 308.

Next, referring back to FIG. 6C, at least one metallization layer 414 is applied to the finished assembly, thus providing connections between semiconductor die units 150. Because of the tight alignment tolerances, the metallization layer 414 can be patterned through a fixed mask. The resulting assembly is protected by a chip carrier protection layer 415, such as polyimide or SOG, and applied by standard techniques.

Figure 8A:
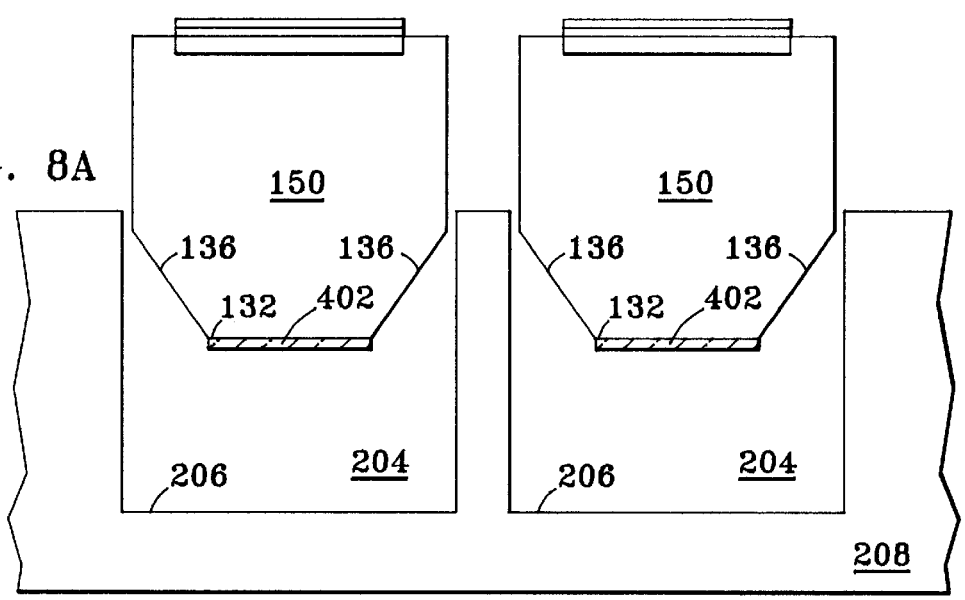
FIGS. 8A through 8C depict an alternate assembly of semiconductor die units with a carrier.
Figure 8B:
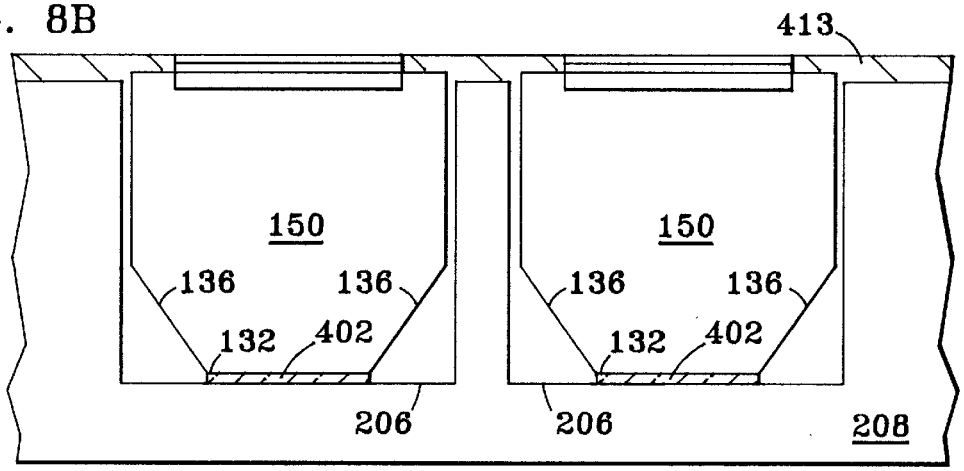
Figure 8C:
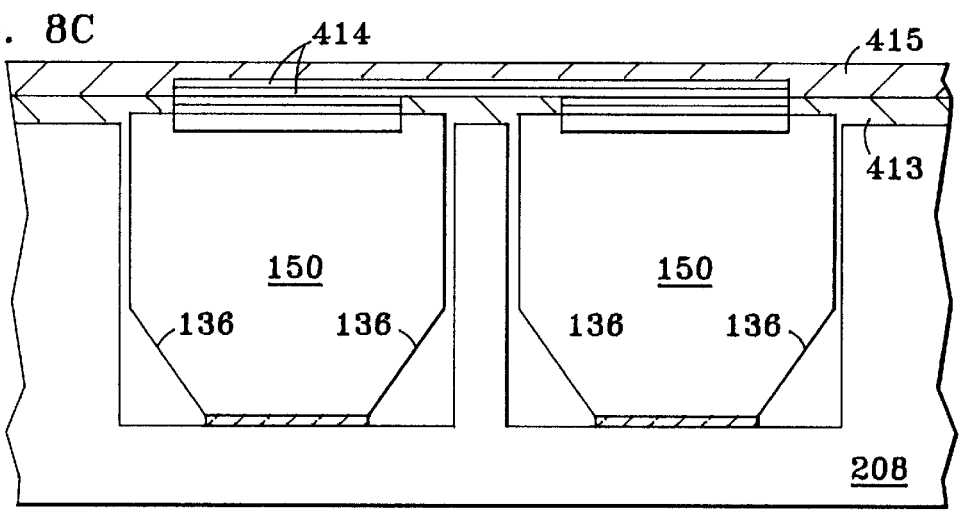

An alternative assembly configuration is shown in FIGS. 8A through 8C, in this case using the die 150 and carrier 208. The sequence is equivalent to that of FIGS. 6A through 6C, in which the tapered reference feature 136 enhances the insertion of the die units 150 into the carrier recesses 204, and the die unit polished surface 132 with binder 402 rest on carrier surface 206.

The present invention enjoys various advantages over prior art schemes. Since both the semiconductor die unit 150 and the recesses 204 or 304 of the carrier 208 or 308 are defined lithographically, and created with anisotropic etching methods, the respective dimensions are highly controllable. The semiconductor die units 150 can, therefore, be designed to fit tightly into the recesses 204 or 304, with a marginal space tolerance as small as 1 $\mu$m or less.

Furthermore, when crystallographic orientational etching is employed, the geometrically defined reference features 136 and 336 at the bottom of the semiconductor die unit 150 and near the bottom of recesses 304, respectively, will allow further self alignment of one to the other. For example, if the D3 dimension in FIG. 5C is equivalent to the D1 dimension in FIG. 2A, the die unit 150 will rest on the (111) surfaces 336 of the recess 304 and their corresponding top surfaces will be parallel with each other.

The ability to control critical dimensions to extremely precise tolerances makes possible the use of a fixed mask for the final metallization steps rather than more expensive methods, thereby reducing over the prior art the cost of manufacturing the assemblies. The method also reduces the overall areal size of the assembly due to smaller space requirements.

Additionally, the invention results in improved device performance and lower power dissipation, due to denser wiring, shortened wire lengths, and the use of internal chip drivers and lighter electrical loads.

Still another advantage is improved overall chip yields of such chip assemblies over single large area chips having similar functionality. The improved yield derives from the generally superior yields of smaller chips coupled with pretesting of such chips prior to final assembly.

Still another advantage is the ability to assemble dissimilar semiconductor die units (e.g. silicon, gallium arsenide, etc.), requiring different processing conditions, into a final chip assembly.

While the invention has been described in terms of a few preferred embodiments, those skilled in the art will recognize that the invention can be practiced with modification within the spirit and scope of the appended claims. For example, by causing the die unit and carrier to take on other shapes, such as nonrectangular shapes, the alignment and orientation of the die units to the carrier recesses can benefit. Thus, geometric alignment keys of various designs can be included in this fabrication methodology.

What is claimed is:

1. A semiconductor substrate suitable for forming at least one semiconductor die unit, the semiconductor substrate comprising:

a semiconductor body having a first surface and a generally opposing second surface, at least one area extending from and below the first surface suitable for forming therein semiconductor devices, the at least one area being contiguously bounded by a trench extending below the first surface, the trench walls being lined with a polish stop; and wherein the lined trench is filled with a dielectric material.

2. The semiconductor substrate as recited in claim 1 wherein the dielectric material is one of the group comprising silicon dioxide, borosilicate glass and borophosphosilicate glass.

3. A semiconductor substrate suitable for forming at least one semiconductor die unit, the semiconductor substrate comprising:

a semiconductor body having a first surface and a generally opposing second surface, at least one area extending from and below the first surface suitable for forming therein semiconductor devices, the at least one area being contiguously bounded by a trench extending below the first surface, the trench walls being lined with a polish stop; and wherein the lined trench is filled with polycrystalline silicon.

4. A semiconductor integrated circuit configuration comprising:

a carrier comprising a substrate having a first surface and a second surface, the first surface having at least one recess sized for receiving at least one semiconductor die unit, the at least one recess having a bottom surface; and at least one semiconductor die unit disposed within the at least one recess of the carrier, the at least one semiconductor die unit having a first surface and a generally opposing second surface, the first surface having an active area in which semiconductor devices are formed; and further having at least a first metallization layer disposed on the first surface of the first semiconductor substrate for forming interconnections between the semiconductor devices;

wherein the second surface of the at least one semiconductor die unit and the bottom surface of the at least one recess are in a generally facing relation and the first surface of the at least one semiconductor die unit is more distal to the second surface of the carrier than is the second surface of the semiconductor die unit.

5. The semiconductor integrated circuit configuration as claimed in claim 4 wherein the carrier has a plurality of recesses for receiving a plurality of semiconductor die units and wherein the second metallization layer forms interconnections between semiconductor die units.

6. The semiconductor integrated circuit configuration as claimed in claim 5 wherein a first semiconductor die unit is formed using a first fabrication method and a second semiconductor unit is formed using a second dissimilar fabrication method.

7. The semiconductor integrated circuit configuration as claimed in claim 5 wherein a first semiconductor die unit is formed from a first semiconductor material and second semiconductor die unit is formed using a second semiconductor material.

8. The semiconductor integrated circuit configurations claimed in claim 7 wherein the first semiconductor material is silicon and the second semiconductor material is gallium arsenide.

9. The semiconductor integrated circuit configuration as claimed in claim 4 wherein the at least one semiconductor die unit is pretested prior to disposal within the at least one recess of the carrier.

10. The semiconductor integrated circuit configuration as claimed in claim 4 wherein the semiconductor die units each include a first reference feature proximal to the second surface of the semiconductor die unit, wherein each recess of the carrier includes a second reference feature proximal to the bottom surface of the recess, and wherein the first and second reference feature are cooperatively configured.

11. The semiconductor integrated circuit configuration as claimed in claim 4 wherein the semiconductor die units each include a first reference feature proximal to the second surface of the semiconductor die unit, each recess of the carrier includes a second reference feature proximal to the bottom surface of the recess, and the first and second reference feature are generally complementary.

12. The semiconductor integrated circuit configuration as claimed in claim 11 wherein the first and second reference feature are formed by crystallographic orientation selective etching.

13. The semiconductor integrated circuit configuration as claimed in claim 4, wherein the at least one semiconductor die unit is self-aligning with respect to the at least one recess.

14. The semiconductor integrated circuit configuration as recited in claim 4 further comprising a second metallization layer disposed over the first surface of the semiconductor die unit and the first surface of the second semiconductor substrate, the metallization layer for forming interconnections.

* * * * *